United States Patent [19]

Sakurai et al.

[11] Patent Number: 4,694,322

[45] Date of Patent: Sep. 15, 1987

[54] PRESS-PACKED SEMICONDUCTOR DEVICE

[75] Inventors: Hiroshi Sakurai, Kawasaki; Masami Iwasaki, Yokohama, both of Japan

[73] Assignee: Kabushiki Kaisha Toshiba, Japan

[21] Appl. No.: 650,107

[22] Filed: Sep. 13, 1984

[30] Foreign Application Priority Data

Sep. 29, 1983 [JP] Japan ................................ 58-181284
Sep. 29, 1983 [JP] Japan ................................ 58-181286

[51] Int. Cl.$^4$ ...................... H01L 23/02; H01L 23/44; H01L 25/04; H01L 21/447
[52] U.S. Cl. ........................................ 357/74; 357/79; 357/75; 357/82
[58] Field of Search ....................... 357/74, 82, 75, 80, 357/79

[56] References Cited

U.S. PATENT DOCUMENTS

| | | | |
|---|---|---|---|
| 3,918,084 | 11/1975 | Shierz | 357/82 |
| 4,047,197 | 9/1977 | Shierz | 357/75 |
| 4,218,695 | 8/1980 | Egerbacher et al. | |
| 4,390,891 | 6/1983 | Bahlinger | |
| 4,499,485 | 2/1985 | Shierz et al. | 357/75 |

FOREIGN PATENT DOCUMENTS

| | | |
|---|---|---|
| 35135 | 9/1981 | European Pat. Off. |
| 64856 | 11/1982 | European Pat. Off. |
| 2942409 | 4/1981 | Fed. Rep. of Germany |
| 2395603 | 1/1979 | France |
| 56-130958 | 10/1981 | Japan |
| 57-15452 | 1/1982 | Japan |
| 57-10959 | 1/1982 | Japan |

Primary Examiner—Andrew J. James
Assistant Examiner—S. V. Clark
Attorney, Agent, or Firm—Finnegan, Henderson, Farabow, Garrett & Dunner

[57] ABSTRACT

A common insulation plate is provided on a heat-discharging support member, and a plurality of press-packed semiconductor elements is provided on the common insulation plate. These semiconductor elements are coupled to electrodes which form a common electrode by a plurality of spring mechanisms. An internal connection terminal is slidably provided at each of the electrodes and is bent perpendicular to a pressing surface. Each of the internal connection terminals faces the adjacent one. After the electrodes are pressed against the respective semiconductor elements with adjustment, the internal connection terminals are electrically coupled together.

15 Claims, 5 Drawing Figures

4,694,322

PRESS-PACKED SEMICONDUCTOR DEVICE

BACKGROUND OF THE INVENTION

This invention relates to a press-packed semiconductor device comprising high-power modules, such as transistors and thyristors.

An example of a conventional high-power semiconductor module is a transistor module as shown in FIG. 1. In FIG. 1, numeral 1 denotes a first transistor composite comprising a power transistor 11 and a diode 12, and numeral 2 represents a second transistor composite comprising a power transistor 13 and a diode 14. These first and second transistor composites 1, 2 are commonly connected to a metal substrate 17 through insulation substrates 15 and 16, respectively. The first and second transistor composites 1, 2 are housed in a package 18. A collector electrode terminal 19 of the first transistor composite 1, a collector electrode terminal 21 of the second transistor composite 2, which is coupled to an emitter electrode terminal 20 of the first transistor composite 1, and an emitter electrode terminal 22 of the second transitor composite 2 are arranged to extend outside of the package 18 on the top side thereof.

This arrangement provides easy assembling of the transistor module into an electric device and reduces the space necessary for installation, thus lightening the electric device.

The conventional transistor module, however, has the following drawbacks. Connection lines are bonded or soldered to the emitter electrodes and the collector electrodes of the first and second transistor composites 1 and 2. With a transistor module of a large current, e.g., above 100 A, such a connection causes current to concentrate on the bonded or soldered sections. This results in thermal distortion or thermal fatigue, making it difficult to provide a desirable high-power transistor module. Further, if the bonded or soldered sections are damaged by over-current, a sort of explosion may occur, namely, melted silicon may spout out from the package 18. Furthermore, because the metal substrate 17, package 18 and electrode terminals extending outside the package are simultaneously sealed by adhesive resin, a crack may easily occur due to the difference in the thermal expansion coefficients of the individual materials, impeding a proper sealing.

SUMMARY OF THE INVENTION

The objective of this invention is to provide a reliable press-packed semiconductor device which prevents current concentration on connecting sections between a plurality of circuit elements assembled in the same semiconductor device and between a plurality of semiconductor elements.

This invention provides a press-packed semiconductor device comprising a heat-discharging support member; a common insulating plate provided on the support member; a press-packed semiconductor element, which has a plurality of circuit elements assembled in the same semiconductor substrate and which is provided on the insulating plate; a lid provided on the support member for covering the semiconductor element; a common electrode formed on the support member and electrically coupled to the semiconductor element; and a spring member for evenly pressing the common electrode against the individual circuit elements inside the lid.

This invention also provides a press-packed semiconductor device which comprises a heat-discharging support member; a common insulating plate provided on the support member; a plurality of press-packed semiconductor elements arranged on the insulating plate; a lid provided on the support member for covering the semiconductor elements; a plurality of electrodes electrically coupled to the respective semiconductor elements to form a common electrode; a plurality of spring members for respectively pressing the semiconductor elements against the common electrode; a plurality of internal connection terminals slidably provided at the respective electrodes and bent perpendicular to the pressing surfaces of the electrodes, each internal connection terminal facing the adjacent internal connection terminal; and means for electrically connecting the adjacent, facing internal connection terminals whereby after the electrodes are pressed against the respective semiconductor elements, the internal connection terminals are electrically coupled.

According to this invention, a plurality of circuit elements assembled in the same semiconductor element are coupled to one another through a common electrode pressed against the circuit elements, and a plurality of semiconductor elements is connected to one another by the same manner. Unlike the conventional arrangements employing the bonding or soldering technique, the present arrangement eliminates the possibility of a large current concentrating on a certain area and permits a current to evenly flow through connecting sections, thus preventing any damage due to a large current concentrating on a specific area.

DETAILED DESCRIPTION OF THE PREFERRED EMBODIMENT

An embodiment of this invention will now be explained with reference to the accompanying drawings.

Figure 1:
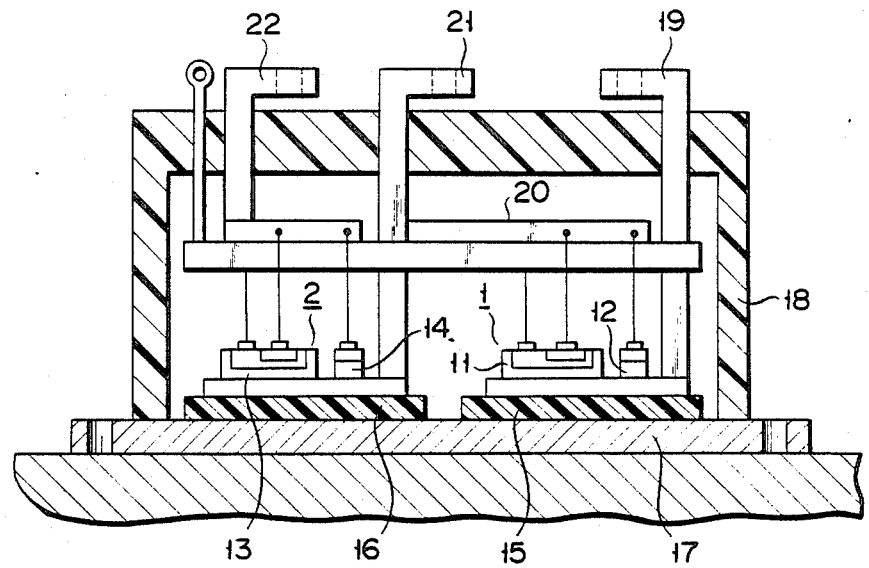
FIG. 1 is a cross-sectional view showing a conventional transistor module.
Figure 2:
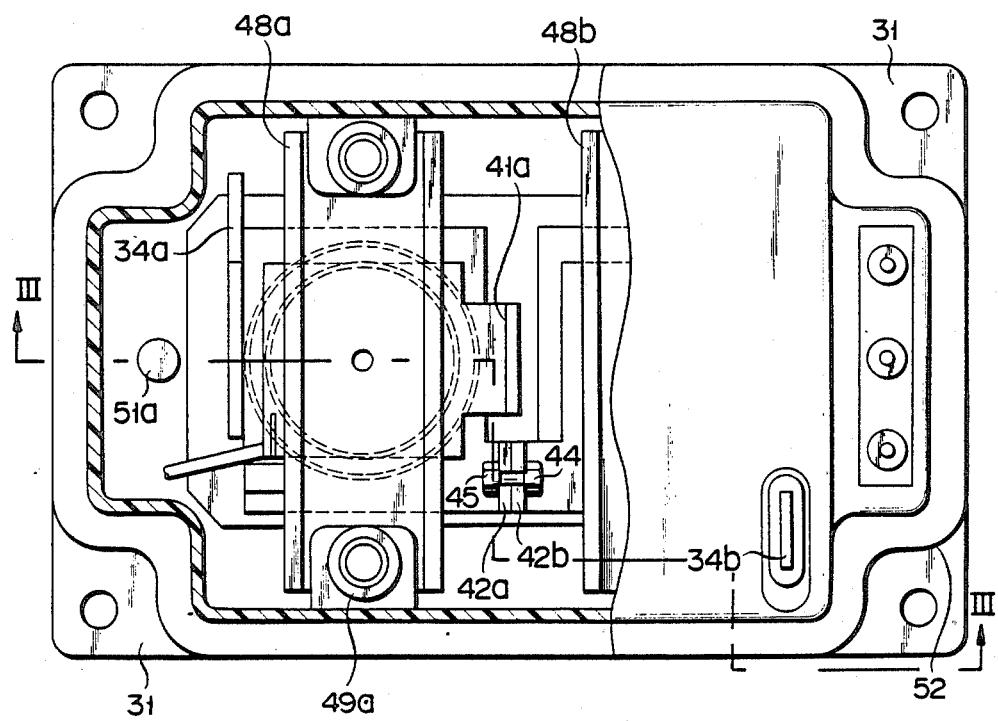
FIG. 2 is a plan view partially showing the interior of a press-packed transistor module embodying this invention.
Figure 3:
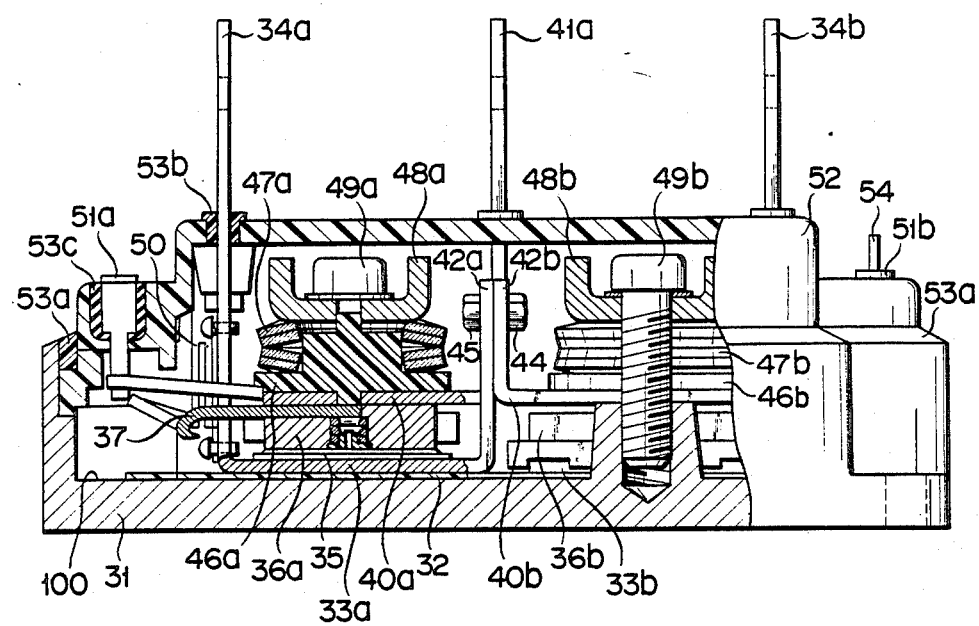
FIG. 3 is a cross-sectional view taken along line III—III in FIG. 2.
Figure 4:
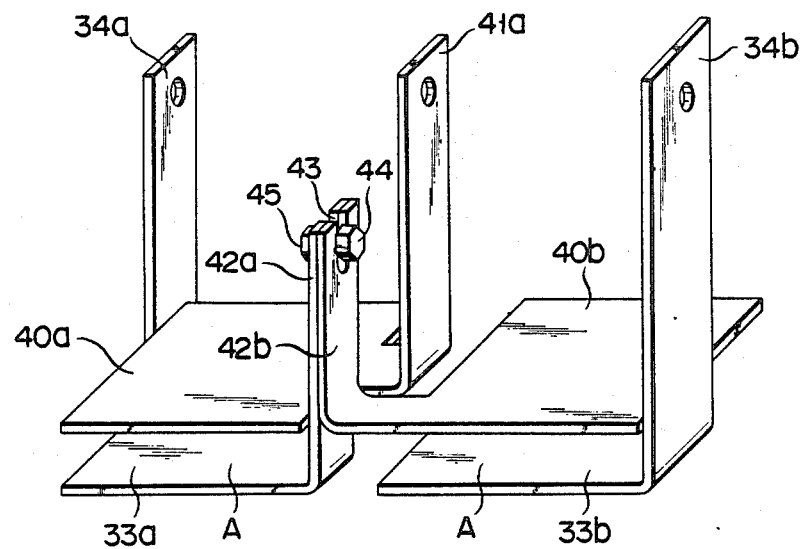
FIG. 4 is an oblique view showing the electrodes used in the module of FIG. 2.

In FIGS. 2 and 3, numeral 31 denotes a heat-discharging substrate which is made of a high thermal conductive metal, such as cast aluminum. On mounting surface 100 of the heat-discharging substrate 31 is provided a ceramic substrate 32 which is electrically insulated and is common to semiconductor elements 35 (to be described later). Two collector electrodes 33a and 33b made of, for example, copper are arranged on the ceramic substrate 32 at predetermined positions, respectively (see FIG. 4). The collector electrode 33a has an external connection terminal 34a bent perpendicular to the pressing surface A of the collector electrode 33a. The collector electrode 33b also has an external connection terminal 34b bent perpendicular to the pressing surface A of the collector electrode 33b. These external connection terminals 34a, 34b extend outside a lid 52 (to be described later) on the top thereof.

Figure 5:
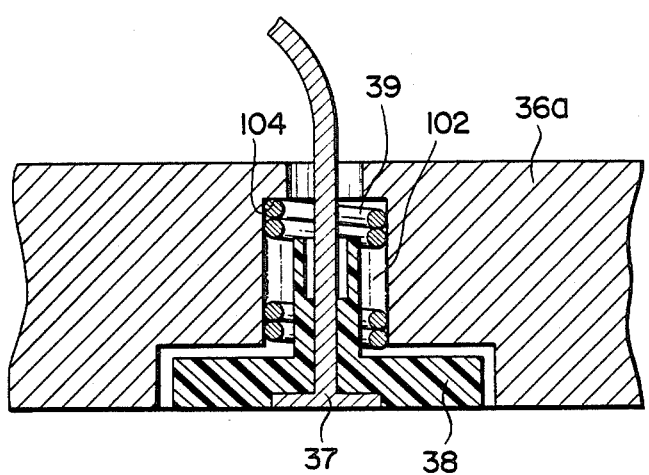
FIG. 5 is a cross-sectional view showing an emitter plate.

A semiconductor element 35 is provided on each of the collector electrodes 33a, 33b. The semiconductor element 35 has two circuit elements, a main transistor and a free wheeling diode, provided on the same semiconductor substrate. Emitter plates 36a and 36b made of, for example, copper, are provided on the respective semiconductor elements 35, 35. In FIG. 3, only the semiconductor element of the left-hand device is shown. Semiconductor element 35 of the right-hand device is mounted between collector electrode 33b and emitter plate 36b in the same manner that semiconductor element 35 of the left-hand device is mounted between collector electrode 33a and emitter plate 36a. These emitter plates 36a, 36b have the configuration as illustrated in FIG. 5 (the emitter plate 36a is exemplified in this figure). Emitter plate 36a is provided with a through hole 102 having a spring support surface 104 that faces semiconductor element 35. A base lead 37, an insulation guide member 38 and a spring 39 are provided in the through hole 102 of the emitter plate 36a. The resilient force of the spring 39 presses the base electrode of the semiconductor element 35 against the base lead 37.

Emitter electrodes 40a and 40b are respectively provided on the emitter plates 36a, 36b. Like the collector electrodes 33a, 33b, the emitter electrode 40a has an external connection terminal 41a, which is bent perpendicular to the pressing surface A (see FIG. 4) and extends outside the lid 52 on the top thereof. The other emitter electrode 40b has an internal connection terminal 42b bent perpendicular to the pressing surface A. The collector electrode 33a has an internal connection terminal 42a, which is shaped similar to the internal connection terminal 42b, and which faces it. These internal connection terminals 42a, 42b have a groove 43 of, for example, a U-shape at the distal end. The collector electrode 33a and the emitter electrode 40b are electrically connected by a bolt 44 and a nut 45 fastened at the grooves 43, 43, thus forming a common electrode for the two semiconductor elements 35, 35.

On the emitter electrode 40a is mounted an insulation member 46a resistant to spring force and a spring mechanism, which comprises a cup spring 47a assembled in the insulation member 46a and a metal fixing plate 48a. Similarly, on the emitter electrode 40b is mounted an insulation member 46b resistant to the force of a spring and a spring mechanism, which comprises a cup spring 47b assembled in the insulation member 46b, and a metal fixing plate 48b. The metal fixing plates 48a, 48b are fixed to the heat-discharging substrate 31 by bolts 49a and 49b, respectively. This arrangement permits the resilient force of the cup springs 47a, 47b to press the individual electrodes, semiconductor elements 35, ceramic substrate 32 and heat-discharging substrate 31 against each other.

Each of the collector electrodes 33a, 33b is coupled to a driving circuit element 50, such as a driving transistor and a speed-up diode, which is provided separately from the corresponding semiconductor. Unlike the semiconductor elements 35 forced to contact the collector electrodes 33a, 33b by means of the spring mechanisms, the driving circuit elements 50 are bonded or soldered to these collector electrodes. Numerals 51a and 51b denote external connection terminals each coupled to a base terminal and an emitter terminal.

The device thus arranged is protected by a gel material to prevent damage to the individual electrodes which may result from poor insulation. The heat-discharging substrate 31 is covered with a lid 52 made of, for example, epoxy resin. The space between the heat-discharging substrate 31 and the lid 52 is filled with an adhesive 53a, which is epoxy-resin-based, for example. After the designated holes in the lid 52 have received the external connection terminals 34a, 34b, 41a, they are sealed with another epoxy-resin-based adhesive 53b. Similarly, any remaining holes in the lid 52, after receiving the external connection terminals 51a, 51b, are sealed with an epoxy-resin-based adhesive 53c. The adhesive 53a has a thermal expansion coefficient close to that of aluminum (Al) which is the material for the heat-discharging substrate 31. In contrast, the adhesives 53b, 53c have a thermal expansion coefficient close to that of copper (Cu) which is the material for the external connection terminals 34a, 34b, 41a, 51a, 51b. The difference in the thermal expansion coefficient between the adhesive 53a and the adhesives 53b, 53c thermally increases the sealing effect.

The lid 52 is also provided with a tube 54 for mixing nitrogen in the gel inside the lid 52 to form spaces. These spaces suppress the expansion of the gel due to the increase in temperature.

In the aforementioned press-packed transistor module, first, the spring mechanisms comprising the cup springs 47a, 47b are mounted on the emitter electrodes 40a, 40b, respectively. The bolts 49a and 49b are separately fastened so that the two semiconductor elements 35, 35 can be evenly pressed by the spring mechanisms. Then, the bolts 44 and nut 45 are fastened together at the grooves 43, 43 so as to electrically connect the internal connection terminal 42a of the collector electrode 33a and the internal connection terminal 42b of the emitter electrode 40b, thus forming the common electrode.

When the electrode surfaces of two or more circuit elements are to be evenly pressed by a single common electrode, it is extremely difficult to evenly press the electrode surfaces due to the difference in precision of the sizes of the parts or semiconductor elements. Accordingly, there may arise an imbalence in pressure between the semiconductor elements or electrodes. This results in mechanical distortion, deteriorating the semiconductor elements, or an increase in temperature when heat-discharging partially occurs, also deteriorating the semiconductor elements.

According to the transistor module of the embodiment, two circuit elements, a main transistor and a feedback diode, are assembled in a single semiconductor element 35 and the electrodes of the two elements are evenly pressed, thus applying pressure evenly.

Further, the two semiconductor elements 35, 35 of the transistor module are interconnected through the collector electrode 33a and the emitter electrode 40b. These electrodes respectively have internal connection terminals 42a and 42b arranged so as to face each other. This enables the emitter electrode 40b to slide in a direction perpendicular to the surface A. As a result, after the collector electrode 33a and the emitter electrode 40b are separately pressed, the internal connection terminals 42a, 42b are fastened with the bolt 44 and nut 45 to make those electrodes a common electrode. Therefore, the individual electrodes of the two semiconductor elements 35, 35 can be pressed evenly and coupled together.

The elements of the semiconductor device are classified into two groups: one from which current can be obtained by a spring-pressured connection and the other from which it is difficult to obtain the current by that connection. The application of spring pressure even to the second section reduces area efficiency and is therefore uneconomical. In the aforementioned transistor module, the semiconductor elements 35, 35 such as the main transistors, which are the current-obtainable elements, are subjected to pressure-coupling by the spring mechanisms. On the other hand, the driving circuit elements 50, such as driving transistors and which are difficult to provide current, are soldered to the collector electrodes 33a, 33b at the locations other than the press-coupled portions. This arrangement improves the area efficiency and makes it possible to miniaturize the semiconductor device.

In the above-described embodiment, the collector electrode 33a of one of the semiconductor elements 35, 35 is coupled to the emitter electrode 40b of the other semiconductor element 35 to form a common electrode, providing a series circuit arrangement. However, a parallel circuit arrangement merely requires that the emitter electrodes 40a and 40b should be coupled together to form the common electrode and should have internal connection terminals, respectively.

Also, in the emcoupled together to form the common electrode and should have internal connection terminals, respectively.

Also, in the embodiment, a plurality of circuit elements such as a main transistor and a free wheeling diode is assembled in a single semiconductor element 35, and these elements are pressed by a single spring mechanism. But, this invention is not limited to such a configuration. The circuit elements may be assembled in different semiconductor elements, which are evely pressed by a plurality of spring mechanisms.

The preferred embodiment described above is directed to a transistor module. However, this invention is not limited to such a case; it may, of course, be applied to other modules such as a thyristor module.

What is claimed is:

1. A press-packed semiconductor device, comprising:
   a. a heat-discharging support member having a mounting surface;
   b. a lid disposed on said support member and defining a cavity therebetween;
   c. a press-packed semiconductor element disposed in said cavity and having first and second sides, a first electrode contact positioned on said first side, and second and third electrode contacts positioned on said second side, said semiconductor element being spaced-apart from said mounting surface of said support member with one of said sides facing said mounting surface;
   d. a first electrode plate including a first pressing portion disposed in said cavity and contacting said first side of said semiconductor element to form an electrical connection with said first electrode contact of said semiconductor element, said first electrode plate further including a lead portion extending from said first pressing portion through said lid and having an end positioned outside said cavity;
   e. a second electrode plate including a second pressing portion disposed in said cavity and spaced apart from said second side of said semiconductor element, said second electrode plate further including a lead portion extending from said second pressing portion through said lid and having an end positioned outside said cavity;
   f. a conducting plate disposed between said second side of said semiconductor element and said second pressing portion of said second electrode plate to form an electrical connection between said second electrode contact of said semiconductor element and said second electrode plate, said conducting plate including a through hole positioned at said third electrical contact of said semiconductor element;
   g. a lead wire extending through said through hole of said conducting plate and having an end portion contacting said third electrical contact of said semiconductor element to form an electrical connection between said lead wire and said third electrode contact;
   h. first pressing means for elastically pressing together said pressing portions of said first and second electrode plates to maintain said electrical connections between said first electrode contact of said semiconductor element and said first electrode plate and between said second electrode contact of said semiconductor element and said second electrode plate; and
   i. second pressing means for elastically pressing said end portion of said lead wire toward said third electrode contact of said semiconductor element to maintain said electrical connection between said lead wire and said third electrode contact.

2. The press-packed semiconductor device according to claim 1, wherein said first pressing means includes:
   an insulation member disposed on a side of said second pressing portion of said second electrode plate opposite said conducting plate;
   an anchoring plate disposed on said insulation member;
   means for fixing said anchoring plate to said support member; and
   spring means for biasing said insulation member away from said anchoring plate and toward said second pressing portion of said second electrode plate.

3. The press-packed semiconductor device according to claim 2, wherein said fixing means includes a pair of bolts threadably connected to said support member.

4. The press-packed semiconductor device according to claim 2, wherein said spring means includes a cup spring disposed between said insulation member and said anchoring plate.

5. The press-packed semiconductor device according to claim 1, wherein said second pressing means includes:
   means for electrically insulating said end portion of said lead wire from said conducting plate; and
   spring means connected between said insulating means and said conducting plate for biasing said end portion of said lead wire toward said semiconductor element.

6. The press-packed semiconductor device according to claim 5, wherein:
   said through hole of said conducting plate includes a spring support surface facing said semiconductor element;
   said insulating means includes an insulating guide member disposed in said through hole and having an end face facing said semiconductor element, said lead wire extending through an interior portion of said guide member and said end portion of said lead wire being exposed at said end face of said guide member; and said spring means includes a coil spring disposed between said spring support surface of said through hole and said guide member.

7. The press-packed semiconductor of claim 1, wherein said first, second, and third electrode contacts of said semiconductor device are, respectively, a collector contact, an emitter contact, and a base contact.

8. The press-packed semiconductor of claim 1, further comprising an insulating plate disposed between said mounting surface of said support member and said first pressing portion of said first electrode plate.

9. The press-packed semiconductor of claim 1, wherein said first and second pressing portions are substantially perpendicular to said first and second lead portions, respectively.

10. A press-packed semiconductor device, comprising:
   a. a heat-discharging support member having a mounting surface;
   b. a lid disposed on said support member and defining a cavity therebetween;
   c. at least two press-packed semiconductor elements disposed in said cavity, each of said semiconductor elements having first and second sides, a first electrode contact positioned on said first side, and second and third electrode contacts positioned on said second side, each of said semiconductor elements being spaced apart from said mounting surface of said support member with one of said sides facing said mounting surface;
   d. at least two first electrode plates each including a first pressing portion disposed in said cavity and contacting said first side of one of said semiconductor elements to form an electrical connection with said first electrode contact of said respective semiconductor element, each of said first electrode plates further including a first lead portion extending from said first pressing portion through said lid and having an end positioned outside said cavity;
   e. at least two second electrode plates each including a second pressing portion disposed in said cavity and spaced apart from said second side of one of said semiconductor elements, at least one of said second electrode plates further including a second lead portion extending from said second pressing portion through said lid and having an end positioned outside said cavity;
   f. at least two conducting plates each disposed between said second side of one of said semiconductor elements and said second pressing portion of one of said second electrode plates to form an electrical connection between said second electrode contact of said respective semiconductor element and said respective second electrode plate, each of said conducting plates including a through hole positioned at said third electrode contact of said respective semiconductor element;
   g. at least two lead wires each extending through said through hole of one of said conducting plates and having an end portion contacting said third electrode contact of said semiconductor element positioned at said through hole of said respective conducting plate to form an electrical connection between said lead wire and said respective third electrode contact;
   h. first pressing means for elastically pressing said second pressing portions of said second electrode plates toward said first pressing portions of said first electrode plates to maintain said electrical connections between said first electrode contacts of said semiconductor elements and said first electrode plates and between said second electrode contacts of said semiconductor elements and said second electrode plates; and
   i. second pressing means for elastically pressing said end portions of said lead wires toward said third electrical contacts of said semiconductor elements to maintain said electrical connections between said lead wires and said third electrode contacts.

11. The press-packed semiconductor device according to claim 10, further comprising an insulating plate disposed between said mounting surface of said support plate and said first pressing portions of said first electrode plates.

12. The press-packed semiconductor device according to claim 11, wherein said first pressing portions of said first electrode plates are substantially coplanar.

13. The press-packed semiconductor device according to claim 10, further comprising means for electrically and mechanically connecting said first electrode plate contacting one of said semiconductor elements with said second electrode plate spaced apart from another of said semiconductor elements.

14. A press-packed semiconductor device, comprising:
   a. a heat-discharging support member having a mounting surface;
   b. a lid disposed on said support member and defining a cavity therebetween;
   c. first and second press-packed semiconductor elements disposed adjacent each other in said cavity, each of said semiconductor elements having first and second sides, a first electrode contact positioned on said first side, and second and third electrode contacts positioned on said second side, each of said semiconductor elements being spaced apart from said mounting surface of said support member with one of said sides facing said mounting surface;
   d. a pair of first electrode plates each including a first pressing portion disposed in said cavity and contacting said first side of one of said semiconductor elements to form an electrical connection with said first electrode contact of said respective semiconductor element, each of said first electrode plates further including a first lead portion extending from said first pressing portion through said lid and having an end positioned outside said cavity, said first electrode plate contacting said first semiconductor element further including a first internal connection terminal extending from said first pressing portion between said first and second semiconductor elements;
   e. a pair of second electrode plates each including a second pressing portion disposed in said cavity and spaced apart from said second side of one of said semiconductor elements, said second electrode plate spaced apart from said first semiconductor element further including a second lead portion extending from said second pressing portion through said lid and having an end positioned outside said cavity, said second electrode plate spaced apart from said second semiconductor element further including a second internal connection terminal extending from said second pressing portion between said first and second semiconductor elements;

f. a pair of conducting plates each disposed between said second side of one of said semiconductor elements and said second pressing portion of one of said second electrode plates to form an electrical connection between said second electrode contact of said respective semiconductor element and said respective second electrode plate, each of said conducting plates including a through hole positioned at said third electrode contact of said respective semiconductor element;

g. a pair of lead wires each extending through said through hole of one of said conducting plates and having an end portion contacting said third electrode contact of said semiconductor element positioned at said through hole of said respective conducting plate to form an electrical connection between said lead wire and said respective third electrode contact;

h. first pressing means for elastically pressing said second pressing portions of said second electrode plates toward said first pressing portions of said first electrode plates to maintain said electrical connections between said first electrode contacts of said semiconductor elements and said first electrode plates and between said second electrode contacts of said semiconductor elements and said second electrode plates;

i. second pressing means for elastically pressing said end portions of said lead wires toward said third electrical contacts of said semiconductor elements to maintain said electrical connections between said lead wires and said third electrode contacts; and j. means for mechanically and electrically connecting said first and second internal connection terminals.

15. The press-packed semiconductor device according to claim 14, wherein:

said first and second internal connection terminals are substantially parallel and each of said internal connection terminals has a free end with a slot opening out of said free end; and said connecting means includes a bolt and nut assembly passing through said slots and clamping said internal connection terminal together.

* * * * *